United States Patent [19]
Totty et al.

[11] Patent Number: 5,302,879
[45] Date of Patent: Apr. 12, 1994

[54] TEMPERATURE/REFERENCE PACKAGE, AND METHOD USING THE SAME FOR HIGH PRESSURE, HIGH TEMPERATURE OIL OR GAS WELL

[75] Inventors: Charles D. Totty; Gary R. Dellinger, both of Duncan, Okla.; Michael P. Mahler, Roanoke, Tex.; Vincent P. Zeller, Flower Mound, Tex.; Everett D. Stokes, Cleburne, Tex.

[73] Assignee: Halliburton Company, Duncan, Okla.

[21] Appl. No.: 999,441

[22] Filed: Dec. 31, 1992

[51] Int. Cl.$^5$ .............................. H01L 41/08
[52] U.S. Cl. ............................ 310/361; 310/333; 310/338; 310/370
[58] Field of Search ............ 310/321, 333, 338, 344, 310/346, 348, 361, 368, 370; 73/703, 708, 772

[56] References Cited

U.S. PATENT DOCUMENTS

| | | | |
|---|---|---|---|
| 3,355,949 | 12/1967 | Elwood et al. | 73/345 |
| 3,561,832 | 2/1971 | Karrer et al. | 310/9.6 |
| 3,617,780 | 11/1971 | Benjaminson et al. | 310/8.2 |
| 4,079,280 | 3/1978 | Kusters et al. | 310/318 |
| 4,160,183 | 7/1979 | Kusters et al. | 310/315 |
| 4,216,402 | 8/1980 | Engdahl | 310/320 |
| 4,293,986 | 10/1981 | Kobayashi et al. | 310/370 |
| 4,344,010 | 8/1982 | Vig et al. | 310/361 |
| 4,362,961 | 12/1982 | Gerber | 310/370 |
| 4,437,773 | 3/1984 | Dinger et al. | 374/117 |
| 4,472,656 | 9/1984 | Franx | 310/361 |
| 4,479,070 | 10/1984 | Frische et al. | 310/338 |
| 4,498,344 | 2/1985 | Dinger | 73/778 |
| 4,512,198 | 4/1985 | Sinha et al. | 73/703 |
| 4,547,691 | 10/1985 | Valdois et al. | 310/361 |
| 4,562,375 | 12/1985 | Besson et al. | 310/338 |
| 4,592,663 | 6/1986 | EerNisse et al. | 374/117 |
| 4,639,631 | 1/1987 | Chason et al. | 310/344 |
| 4,802,370 | 2/1989 | EerNisse et al. | 73/702 |
| 5,012,151 | 4/1991 | EerNisse et al. | 310/346 |

FOREIGN PATENT DOCUMENTS 2202989A 10/1988 United Kingdom ......... H01L 41/04

OTHER PUBLICATIONS

"Quartz Resonator Mounting and Packaging: Requirements and Techniques", Roger W. Ward, pp. 162-175 of 5th Quartz Crystal Conf. Proc. (1983).

"Processing of a Five Reasonator VHF Crystal Device", C. W. Shanley, L. N. Dworsky, J. A. Whalin, G. C. Clifford & M. N. Scansaroli, pp. 367-371 of Proc. Freq. Control Symp. (1985).

"The Motorola Multi-Pole Monolithic Filter Project", L. N. Dworsky and C. S. Shanley, pp. 486-490 of Proc. Freq. Control Symp. (1985).

*Primary Examiner*—Mark O. Budd
*Assistant Examiner*—Thomas M. Dougherty
*Attorney, Agent, or Firm*—Stephen R. Christian; E. Harrison Gilbert, III

[57] ABSTRACT

A dual crystalline resonator package comprises either (1) two crystalline bodies, in adjoining cavities of which bodies a crystalline temperature resonator and a crystalline reference resonator are respectively connected and which bodies are directly connected together, or (2) such two crystalline bodies in conjunction with a third crystalline body which is connected directly between the two first-mentioned bodies and to opposite sides of which third body the resonators are connected so that the resonators extend therefrom into the cavities of the two first-mentioned bodies. Either of these embodiments can be used for generating temperature data signals in a high pressure, high temperature well wherein the respective embodiment is lowered and exposed to such high pressure and high temperature. A modification of the second embodiment eliminates one of the resonators and the respective body having the cavity into which the eliminated resonator would otherwise extend.

20 Claims, 3 Drawing Sheets

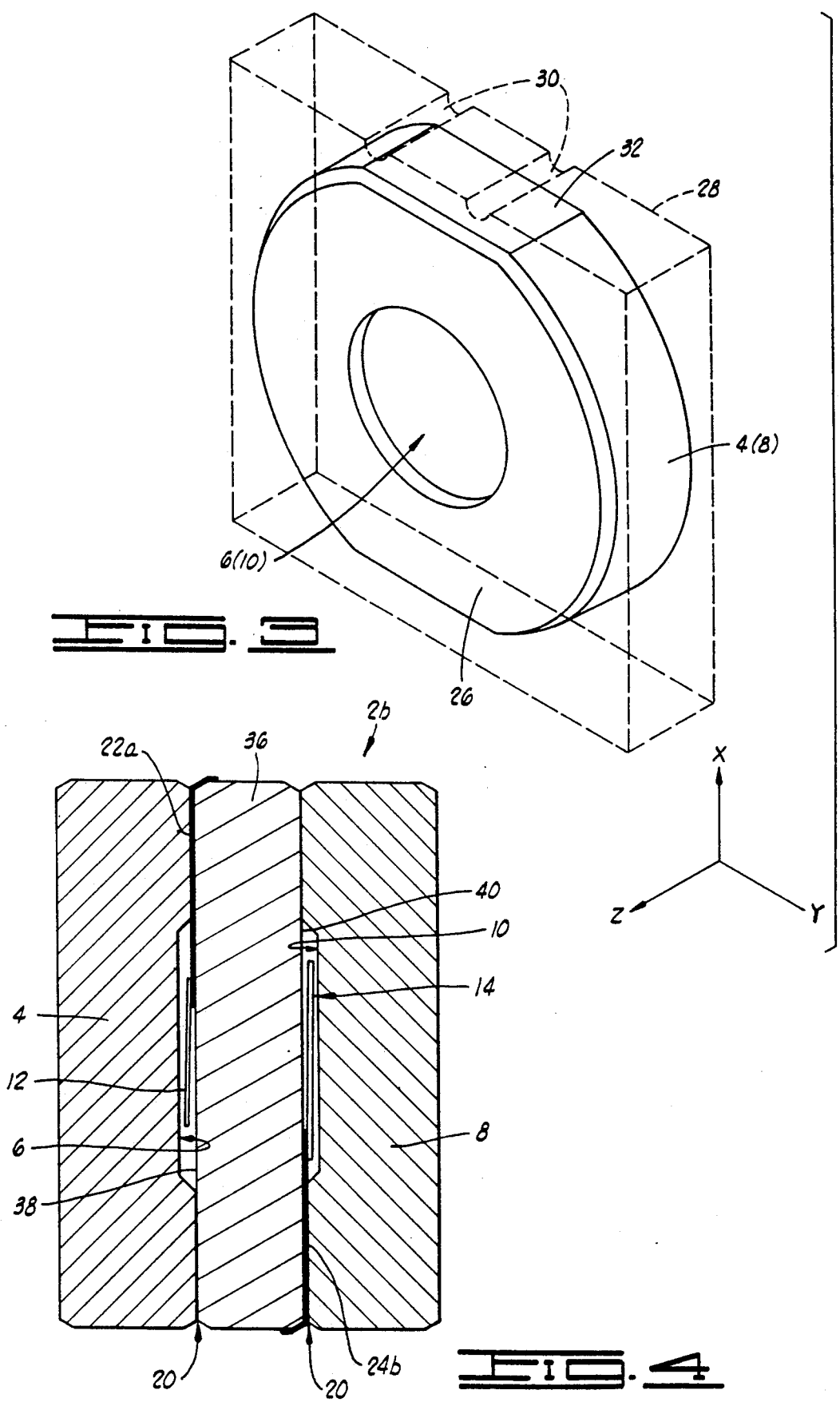

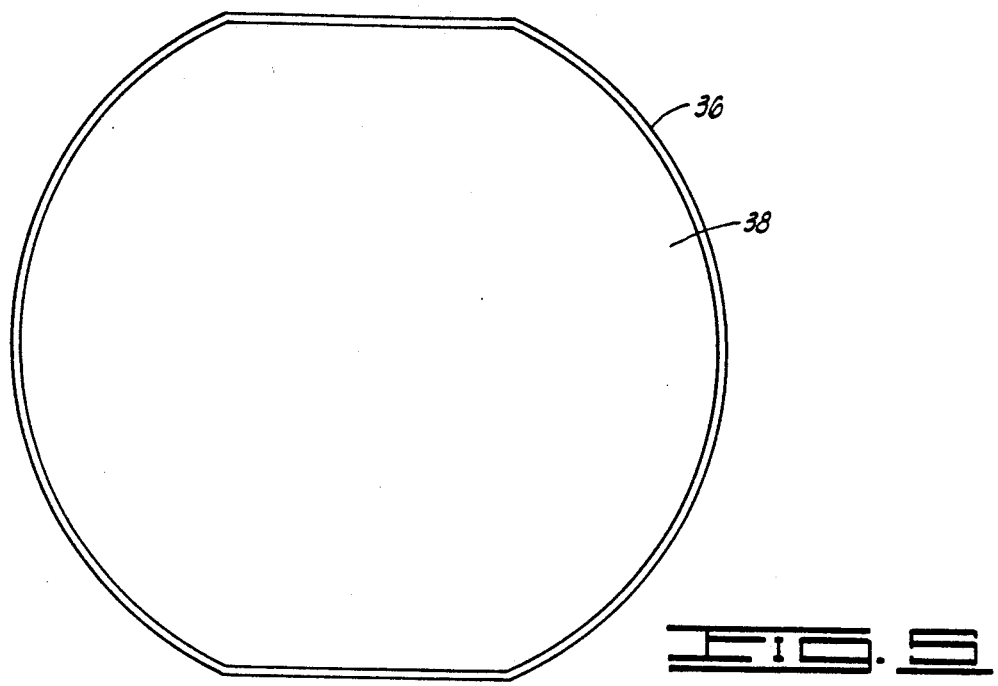
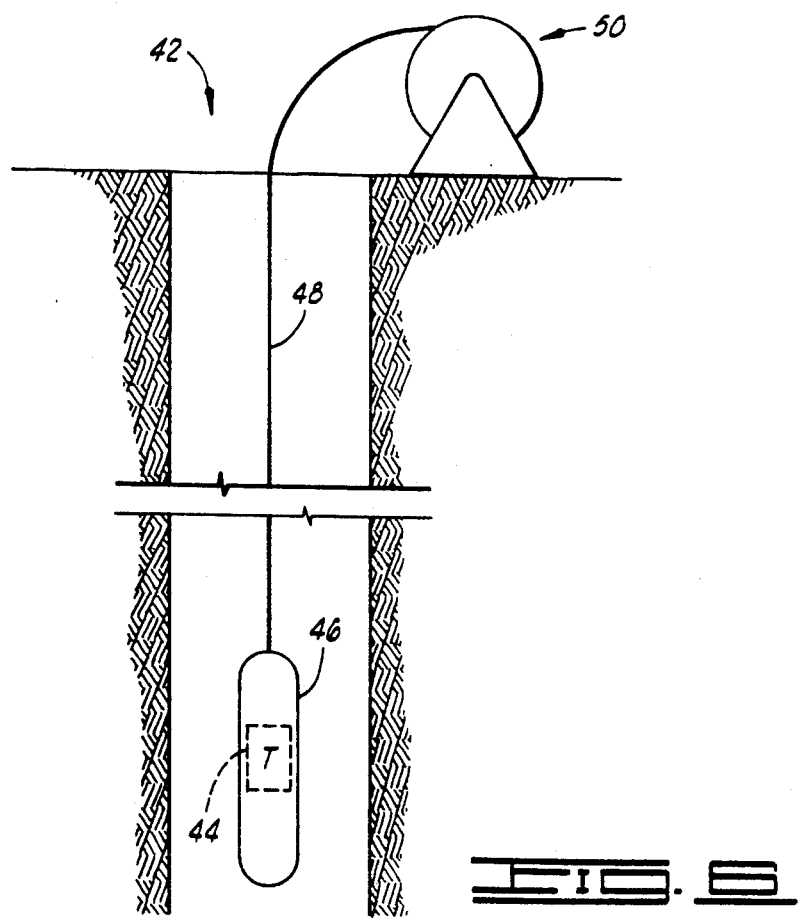

TEMPERATURE/REFERENCE PACKAGE, AND METHOD USING THE SAME FOR HIGH PRESSURE, HIGH TEMPERATURE OIL OR GAS WELL

BACKGROUND OF THE INVENTION

This invention relates to a crystalline package having a crystalline temperature resonator and a crystalline reference resonator housed within crystalline bodies that can withstand high pressures and temperatures such as found in deep oil or gas wells. The invention also includes a related method.

During drilling, completing and producing an oil or gas well, temperature and pressure measurements are typically taken from within the well to obtain information about the ability of the well to produce oil or gas. This can be done by lowering quartz crystal pressure and temperature transducers into the well and generating electrical signals in response to the frequencies at which the quartz crystal members oscillate in response to sensed pressure and temperature. Typically a quartz crystal reference member is also provided for compensating for changes in response dye to pressure or temperature. This reference member and the temperature sensing member can be housed together.

The previous combined temperature sensing resonator and reference resonator packaging being used in the oil and gas industry is an assembly of either (1) four Z-cut quartz plates or (2) three Z-cut quartz members with the center member having a central aperture. These are disposed to define a central cavity containing the reference and temperature resonators. See U.S. Pat. No. 4,802,370 to EerNisse et al. for example. The reference resonator in such embodiments typically includes an SC-cut quartz crystal which is essentially independent of pressure, and the temperature resonator typically includes a torsional mode quartz tuning fork. These types of packages are typically positioned adjacent quartz pressure crystals.

These previous types of packages are rated for use up to 16,000 pounds per square inch (psi) at 175 degrees centigrade (° C.). At these maximums, package failures are encountered, usually resulting in separation or fracturing of the Z-cut quartz plates. Because pressures and temperatures exceeding these limits are encountered in oil and gas wells, there is the need for an improved temperature/reference package that is reliably functional above these prior limits.

SUMMARY OF THE INVENTION

The present invention overcomes the above-noted and other shortcomings of the prior art by providing a novel and improved dual crystalline resonator package and a method of sensing temperature and providing a reference in a high pressure, high temperature oil or gas well. Although functional at lower pressures and temperatures, the package of the present invention can preferably withstand and remain functional at pressures and temperatures exceeding the above rating of previous packages.

One dual crystalline resonator package of the present invention comprises: a first crystalline body having a cavity defined therein; a second crystalline body having a cavity defined therein, the first and second crystalline bodies connected directly together so that the cavities adjoin; a crystalline temperature resonator connected to the first crystalline body within the cavity thereof; and a crystalline reference resonator connected to the second crystalline body within the cavity thereof.

Another crystalline resonator package of the present invention comprises: a first crystalline body having a cavity defined therein; a second crystalline body having a continuous surface spanning an entire side of the second crystalline body; a crystalline resonator connected to the continuous surface; and wherein: the first crystalline body is connected to the continuous surface so that the crystalline resonator is disposed in the cavity of the first crystalline body. Another crystalline resonator and cavity-containing body can be added.

The method of the present invention for sensing temperature and providing a reference in a high pressure, high temperature oil or gas well, comprises: lowering a transducer package into the well to a depth where pressure is from above 16,000 to 25,000 pounds per square inch and temperature is from above 175° to 200° C., the transducer package including one of the aforementioned crystalline resonator packages; exposing the transducer package to the pressure and temperature so that, if both are included, the crystalline temperature resonator oscillates at a frequency responsive to the temperature and the crystalline reference resonator oscillates at a frequency essentially independent of the pressure; and generating temperature data signals and reference signals in response to the frequencies of the crystalline temperature resonator and the crystalline reference resonator (if both are used).

Therefore, from the foregoing, it is a general object of the present invention to provide a novel and improved dual crystalline resonator package and a method of sensing temperature and providing a reference in a high pressure, high temperature oil or gas well. Other and further objects, features and advantages of the present invention will be readily apparent to those skilled in the art when the following description of the preferred embodiments is read in conjunction with the accompanying drawings.

BRIEF DESCRIPTION OF THE DRAWINGS

FIG. 3 is a perspective view, oriented relative to X, Y and Z crystallographic axes, of one of the crystalline bodies included in the dual crystalline resonator package shown in FIG. 1.

FIG. 4 is a sectional end view, comparable to the view of FIG. 2, for another embodiment of the dual crystalline resonator package of the present invention.

FIG. 5 is a side view of an intermediate crystalline body of the embodiment of FIG. 4.

FIG. 6 is a schematic illustration showing the package of the present invention lowered into an oil or gas well.

DETAILED DESCRIPTION OF THE PREFERRED EMBODIMENTS

Figure 1:
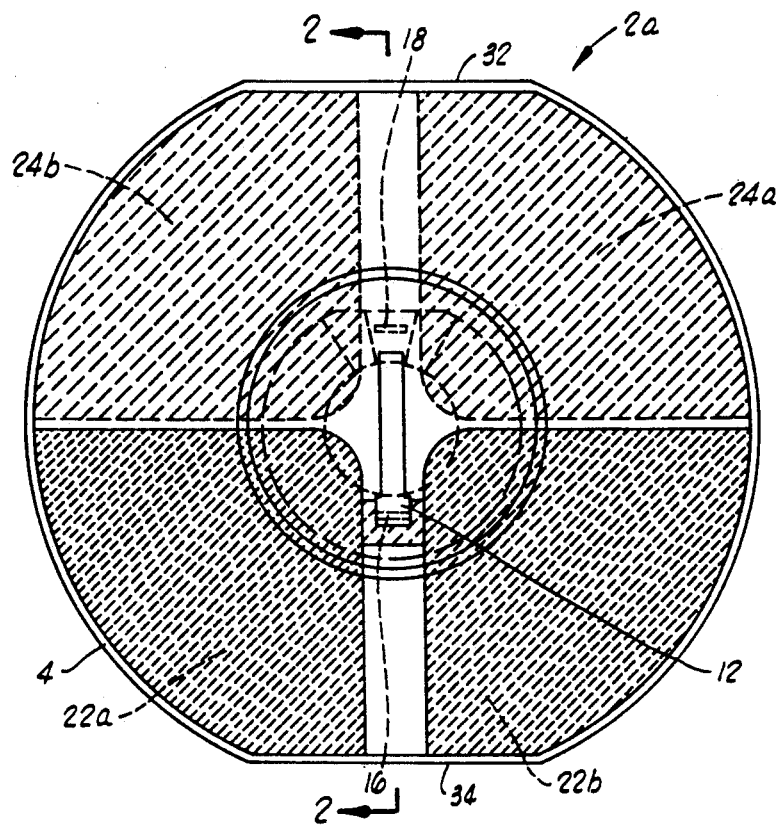
FIG. 1 is a side view of one embodiment of the dual crystalline resonator package of the present invention.
Figure 2:
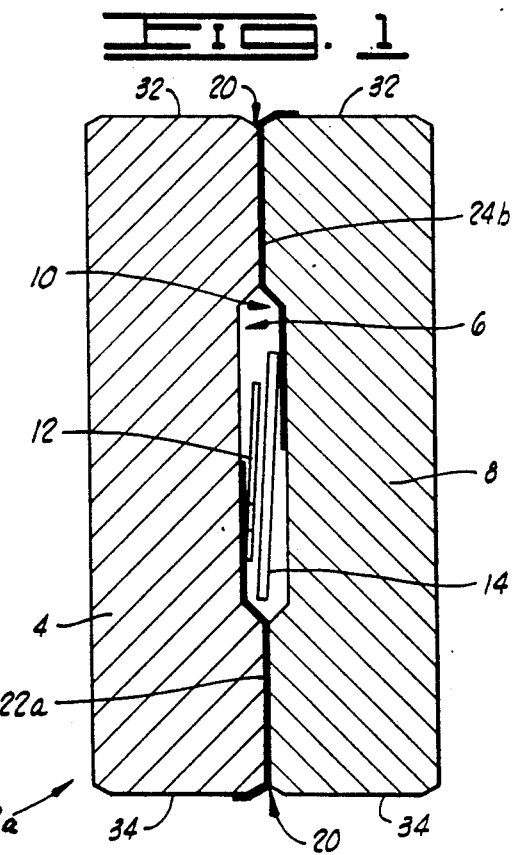
FIG. 2 is a sectional end view of the embodiment as taken along line 2—2 in FIG. 1.

Referring to FIGS. 1 and 2, one embodiment of a dual crystalline resonator package 2a of the present invention comprises a first crystalline body 4 having a cavity 6 defined therein and a second crystalline body 8 having a cavity 10 defined therein. The crystalline bodies 4, 8 are connected directly together so that the cavities 6, 10 adjoin to define a chamber. A crystalline temperature resonator 12 is connected to the first crystalline body 4 within the cavity 6. A crystalline reference resonator 14 is connected to the second crystalline body 8 within the cavity 10.

The first crystalline body 4 and the second crystalline body 8 define part of a housing. The housing for the members 12, 14 of this preferred embodiment consists only of these two bodies and the following: first bonding material 16 (FIG. 1) bonding the crystalline temperature resonator 12 to the first crystalline body 4 in the cavity 6; second bonding material 18 (FIG. 1) bonding the crystalline reference resonator 14 to the second crystalline body 8 in the cavity 10; third bonding material 20 (FIG. 2) bonding the first and second crystalline bodies 4, 8 directly together; first electrode means 22a, 22b, disposed on the first crystalline body 4 and between the bonded first and second crystalline bodies 4, 8, for providing external electrically conductive contacts to the crystalline temperature resonator 12; and second electrode means 24a, 24b, disposed on the second crystalline body 8 and between the bonded first and second crystalline bodies 4, 8, for providing external electrically conductive contacts to the crystalline reference resonator 14.

The bonding material 16 and the bonding material 18 are of suitable type or types as known in the art. For example, one or more glass frits can be used. The preferred bonding and mounting of the respective resonator to its respective body is as described in U.S. Pat. No. 5,012,151 to EerNisse et al., the entirety of which is incorporated herein by reference.

The bonding material 20 is also of a suitable type as known in the art. The preferred bonding material is a lead glass frit. A lead glass frit in tape form is applied to one crystalline body containing a cavity. The glass is pre-glazed at about 400° C. for 30 minutes. Sealing occurs in a vacuum furnace where the environment is controlled. The package is sealed at 450° in the presence of one atmosphere of helium. The sealing methods used can be identical to methods disclosed in U.S. Pat. No. 4,802,370 to EerNisse et al., incorporated herein by reference.

The electrode pairs 22a, 22b and 24a, 24b are of suitable electrically conductive material known in the art. In the preferred embodiment they are made of a known chromium and gold composition. The mounting of the electrodes 22, 24 on their respective bodies is done in a manner known in the art so that they electrically contact the respective crystalline resonator within the housing and extend to an outer edge as illustrated to provide a connection locus for connecting the respective crystalline resonator into an electrical oscillator circuit of known type.

The crystalline resonators 12, 14 themselves can also be of types known in the art. Preferably, the crystalline temperature resonator 12 is a conventional torsional mode quartz tuning fork resonator and the crystalline reference resonator is a conventional SC-cut quartz resonator, both as used by Halliburton Services. More generally as to the reference resonator, it can either be of the type having a temperature characteristic to match that of a crystalline pressure resonator whose signal is to be compensated by the signal of the reference resonator, or it can be of the type having a response essentially independent of temperature whereby compensation of the pressure resonator involves mathematical calculations responsive to signals from the reference resonator and the pressure resonator.

Unique to the embodiment of FIGS. 1 and 2 is the directly connected crystalline bodies 4, 8 with their adjoining cavities 6, 10 wherein the resonators 12, 14 are mounted. Each of the crystalline bodies 4, 8 includes a respective Z-cut quartz crystal plate having a respective Z surface 26 (see FIG. 3 depicting a block 28 of quartz crystal, oriented relative to X, Y and Z crystallographic axes as indicated by X-axis indicator notches 30 and the accompanying axes, from which one of the bodies 4, 8 is cut in known manner). As shown in FIG. 3, the respective cavity 6 (or 10) is defined in the Z surface 26 of the respective Z-cut quartz crystal plate defining such cavity's respective body 4 (or 8). Each cavity 6, 10 is centered on its respective Z face. The cavity is generated using a suitable diamond-core drill. In a particular implementation, each cavity is defined by a beveled side surface and by a flat bottom having a 0.300 inch diameter and disposed 0.020 inch below the Z face. In the particular implementation, the beveled side surface has an angle of about 45° relative to the Z face.

Each body 4, 8 as shown in FIGS. 1-3 has edge flats 32, 34 cut so that they are oriented relative to the indicator notches 30 as shown in FIG. 3. The remaining edge surfaces of the body 4, 8 are semicircular. The corner perimeters where the edge surfaces join the Z surface 26 (and its opposite Z surface defining an outer housing surface) are beveled. In a particular implementation, the bevel is at an angle of about 30° measured from the edge surface. Dimensions of a particular implementation of each body 4, 8 include a thickness of 0.165 inch and a length of 0.658 inch from edge flat to edge flat.

Ten of the above-described dual (temperature and reference) crystalline resonator packages have been tested. All ten survived repeated pressure cycling to 20,000 psi at 200° C. Two packages were to be used for destructive tests in an attempt to determine the pressure/temperature limitations of the invention. Both packages tested in this manner survived testing to 30,000 psi at 200° C. No visible damage was observed in either package. Additionally, four prototypes have been calibrated to 175° C. and 20,000 psi and successfully used in actual well environments. Thus, the operating range of the present invention exceeds the operating range of prior devices having a maximum rating of 16,000 psi at 175° C. From the foregoing tests, this extended operating range includes pressure from above 16,000 to at least 25,000 psi at a temperature from above 175° C. to at least 200° C.

Another embodiment of the dual crystalline resonator package of the present invention is shown in FIGS. 4 and 5. This package 2b has the same components as the first-described embodiment (as indicated in FIGS. 4 and 5 by the same reference numerals), but it also has an additional element, namely, a third crystalline body 36. The crystalline body 36 is a solid planar crystalline substrate that has a continuous first Z surface 38 spanning an entire first side of the body 36. The substrate 36 also has a continuous second Z surface 40 spanning an entire second side of the body 36 in opposing relationship to the first surface 38. The body 36 is constructed the same, and has the same configuration and crystalline orientation as, the crystalline bodies 4, 8, except that the crystalline body 36 does not have the cavities of the bodies 4, 8, as is so defined by the foregoing description of the "continuous" first and second surfaces 38, 40. The maximum dimensions of the Z surfaces 38, 40 are the same as for the Z faces of the bodies 4, 8, but the thickness of the body 36 in a specific implementation is 0.125 inch as compared to 0.165 inch for the bodies 4, 8 of such implementation.

In the embodiment of FIGS. 4 and 5, the crystalline temperature resonator 12 and its electrodes 22a, 22b are connected to the first continuous surface 38, and the crystalline reference resonator 14 and its electrodes 24a, 24b are connected to the second continuous surface 40. The crystalline body 4 is connected directly to the surface 38 of the body 36 so that the crystalline temperature resonator 12 is disposed in the cavity 6 of the body 4 and so that the electrodes 22a, 22b are between the bonded bodies 4, 36 in the assembled package. The crystalline body 8 is connected directly to the surface 40 of the body 36 so that the crystalline reference resonator 14 is disposed in the cavity 10 of the body 8 and so that the electrodes 24a, 24b are between the bonded bodies 8, 36 in the assembled package Such connections are made as known in the art as described above.

The embodiment of FIGS. 4 and 5 can be modified by deleting one of the resonators 12, 14 and the respective body 4, 8 (and the accompanying electrodes and bonding material).

It is contemplated that the operating range of the embodiment of FIGS. 4 and 5 (and its single resonator modification described above) is the same as for the embodiment of FIGS. 1-3.

Although at present the embodiment of FIGS. 1-3 is preferred over the embodiment of FIGS. 4 and 5 because the former presently has less pressure dependency, it is contemplated that the embodiment of FIGS. 4 and 5 may at some time or in some applications become more preferred. That is, in the embodiment of FIGS. 1-3, the crystalline bodies 4, 8 can be deflected by pressure such that the crystalline temperature and reference resonators 12, 14 connected to such bodies 4, 8, respectively, may also be deflected. This can create an undesirable pressure effect on the responses of the resonators. It may be possible that by using the substrate 36 and mounting the resonators on the substrate 36, and possibly by making the substrate 36 sufficiently narrow (to avoid affecting resonator response due to radial deflection of the substrate 36) or otherwise adjusting the relative thicknesses of the three main crystalline body pieces, such pressure effects can be diminished or avoided.

The present invention also provides a method of sensing temperature and providing a reference in a high pressure, high temperature oil or gas well 42 schematically represented in FIG. 6. A transducer package 44 of the present invention (such as any of the particular embodiments described with reference to FIGS. 1-3 and 4-5) is lowered into the well to a depth where pressure exceeds prior pressure ratings (namely above 16,000 psi and preferably from above 16,000 to 25,000 psi) and temperature exceeds prior temperature ratings (namely, above 175° and preferably from above (175° to 200° C.). The transducer package 44, which typically adjoins a pressure transducer package such as shown in U.S. Pat. No. 4,802,370 to EerNisse et al., incorporated herein by reference, is exposed to the pressure and temperature at such location so that the crystalline temperature resonator thereof oscillates at a frequency responsive to the temperature and the crystalline reference resonator thereof oscillates at a frequency essentially independent of the pressure (but affected by temperature in the preferred embodiment). Temperature data signals are generated in response to the frequencies of the crystalline temperature resonator and reference signals are generated in response to the crystalline reference resonator.

Lowering of the transducer package 44 can be by any suitable means known in the art, such as in a sonde 46 connected by wireline or slickline 48 to a winching apparatus 50 at the surface. Another example is to make the transducer package 44 part of a drill or other tubing string. Exposure to pressure and temperature can occur as in the tool described in U.S. Pat. No. 4,802,370 to EerNisse et al., incorporated herein by reference. Temperature data signals can be generated in oscillator circuits connected to the resonators 12, 14 (see, for example, U.S. Pat. No. 3,355,949 to Elwood et al. incorporated herein by reference). Reference signals can be generated and used as described in these patents incorporated herein by reference (e.g., to compensate for temperature effects on an associated pressure transducer).

The temperature/reference package and method of the present invention accordingly provides for enhanced reliability in obtaining accurate temperature and pressure measurements even at high pressures and high temperatures in oil or gas wells.

Thus, the present invention is well adapted to carry out the objects and attain the ends and advantages mentioned above as well as those inherent therein. While preferred embodiments of the invention have been described for the purpose of this disclosure, changes in the construction and arrangement of parts and the performance of steps can be made by those skilled in the art, which changes are encompassed within the spirit of this invention as defined by the appended claims.

What is claimed is:

1. A dual crystalline resonator package, comprising:
    a first crystalline body having a cavity defined therein;
    a second crystalline body having a cavity defined therein, said first and second crystalline bodies connected directly together so that said cavities adjoin;
    a crystalline temperature resonator connected to said first crystalline body within said cavity thereof; and
    a crystalline reference resonator connected to said second crystalline body within said cavity thereof.

2. A dual crystalline resonator package as defined in claim 1, wherein each of said first and second crystalline bodies includes a respective Z-cut quartz crystal plate having a respective Z surface.

3. A dual crystalline resonator package as defined in claim 2, wherein each said cavity is defined in said Z surface of the respective said Z-cut quartz crystal plate.

4. A dual crystalline resonator package as defined in claim 3, wherein:
    said crystalline temperature resonator is a torsional mode quartz tuning fork resonator; and
    said crystalline reference resonator is an SC-cut quartz crystal resonator.

5. A dual crystalline resonator package, comprising:
    a crystalline temperature resonator;
    a crystalline reference resonator; and
    a housing for said resonators, said housing consisting of:
        a first crystalline body having a cavity defined therein;
        a second crystalline body having a cavity defined therein;

first bonding material bonding said crystalline temperature resonator to said first crystalline body in said cavity thereof;

second bonding material bonding said crystalline reference resonator to s id second crystalline body in said cavity thereof;

third bonding material bonding said first and second crystalline bodies directly together;

first electrode means, disposed on said first crystalline body and between said bonded first and second crystalline bodies, for providing external electrically conductive contacts to said crystalline temperature resonator; and second electrode means, disposed on said second crystalline body and between said bonded first and second crystalline bodies, for providing external electrically conductive contacts to said crystalline reference resonator.

6. A dual crystalline resonator package as defined in claim 5, wherein each of said first and second crystalline bodies includes a respective Z-cut quartz crystal plate having a respective Z surface.

7. A dual crystalline resonator package a defined in claim 6, wherein each said cavity is defined in said Z surface of the respective said Z-cut quartz crystal plate.

8. A dual crystalline resonator package a defined in claim 7, wherein:
said crystalline temperature resonator is a torsional mode quartz tuning fork resonator; and
said crystalline reference resonator is an SC-cut quartz crystal resonator.

9. A dual crystalline resonator package, comprising:
a crystalline temperature resonator;
a crystalline reference resonator; and
a housing or said resonators, said housing consisting of:
a first crystalline body having a cavity defined therein;
a second crystalline body having a cavity defined therein;
a solid planar crystalline substrate having first and second opposing surfaces to which said crystalline temperature resonator and said crystalline reference resonator are respectively connected;
first electrode means, disposed on said first surface of said substrate and between said first crystalline body and said substrate, for providing external electrically conductive contacts to said crystalline temperature resonator;
second electrode means, disposed on said second surface of said substrate and between said first crystalline body and said substrate, for providing external electrically conductive contacts to said crystalline reference resonator; and wherein
said first crystalline body is connected directly to said first surface of said substrate so that said crystalline temperature resonator is disposed within said cavity of said first crystalline body; and
said second crystalline body is connected directly to said second surface of said substrate so that said crystalline reference resonator is disposed within said cavity of said second crystalline body.

10. A dual crystalline resonator package as defined in claim 9, wherein each of said first and second crystalline bodies includes a respective Z-cut quartz crystal plate having a respective Z surface.

11. A dual crystalline resonator package as defined in claim 10, wherein each said cavity is defined in said Z surface of the respective said Z-cut quartz crystal plate.

12. A dual crystalline resonator package as defined in claim 11, wherein:
said crystalline temperature resonator is a torsional mode quartz tuning fork resonator; and
said crystalline reference resonator is an SC-cut quartz crystal resonator.

13. A method of sensing temperature and providing a reference in a high pressure, high temperature oil or gas well, comprising:
lowering a transducer package into the well to a depth where pressure is from above 16,000 to 25,000 pounds per square inch and temperature is from above 175° to 200° C., said transducer package including a first crystalline body having a cavity defined therein; a second crystalline body having a cavity defined therein, said first and second crystalline bodies connected directly together so that said cavities adjoin; a crystalline temperature resonator connected to said first crystalline body within said cavity thereof; and a crystalline reference resonator connected to said second crystalline body within said cavity thereof;
exposing said transducer package to said pressure and temperature so that said crystalline temperature resonator oscillates at a frequency responsive to said temperature and said crystalline reference resonator oscillates at a frequency essentially independent of said pressure; and
generating temperature data signals and reference signals in response to said frequencies of said crystalline temperature resonator and said crystalline reference resonator.

14. A method as defined in claim 13, wherein each of said first and second crystalline bodies includes a respective Z-cut quartz crystal plate having a respective Z surface and each said cavity is defined in said Z surface of the respective Z-cut quartz crystal plate.

15. A method of sensing temperature and providing a reference in a high pressure, high temperature oil or gas well, comprising:
lowering a transducer package into the well to a depth where pressure is from about 16,000 to 25,000 pounds per square inch and temperature is from about 175° to 200° C., said transducer package including a first crystalline body having a cavity defined therein; a second crystalline body having a continuous surface spanning an entire side of said second crystalline body, wherein each of said first and second crystalline bodies includes a respective Z-cut quartz crystal plate having a respective Z surface and said cavity is defined in said Z surface of the respective Z-cut quartz crystal plate; a crystalline resonator connected to said continuous surface; and wherein said first crystalline body is connected to said continuous surface so that said crystalline resonator is disposed in said cavity of said first crystalline body;
exposing said transducer package to said pressure and temperature so that said crystalline resonator oscillates at a frequency responsive to said temperature; and
generating signals in response to said frequency of said crystalline resonator.

16. A crystalline resonator package, comprising:

a first crystalline body having a cavity defined therein;

a second crystalline body having a first continuous surface and a second continuous surface each spanning an entire respective said of said second crystalline body;

a third crystalline body having a cavity defined therein;

a crystalline temperature resonator connected to said first continuous surface, wherein said first crystalline body is directly connected to said first continuous surface so that said crystalline temperature resonator is disposed in said cavity of said first crystalline body; and a crystalline reference resonator connected to said second continuous surface, wherein said third crystalline body is directly connected to said second continuous surface so that said crystalline reference resonator is disposed in said cavity of said third crystalline body.

17. A crystalline resonator package as defined in claim 16, wherein each of the first, second, and third crystalline bodies includes a respective Z-cut quartz crystal plate having a respective Z surface.

18. A crystalline resonator package as defined in claim 17, wherein said crystalline temperature resonator is a torsional mode quartz tuning fork resonator.

19. A crystalline resonator package as defined in claim 17, wherein said crystalline temperature resonator is an SC-cut quartz crystal resonator.

20. A method of sensing temperature and providing a reference in a high pressure, high temperature oil or gas well, comprising;

lowering a transducer package into the well to a depth where pressure is from about 16,000 to 25,000 pounds per square inch and temperature is from above 175° to 200° C., said transducer package including:

a first crystalline body having a cavity defined therein;

a second crystalline body having a first continuous surface and a second continuous surface each spanning an entire respective side of said crystalline body;

a third crystalline body having a cavity defined therein;

a crystalline temperature resonator connected to said first continuous surface, wherein said first crystalline body is directly connected to said first continuous surface so that said crystalline temperature resonator is disposed in said cavity of said first crystalline body; and a crystalline reference resonator connected to said second continuous surface, wherein said third crystalline body is directly connected to said second continuous surface so that said crystalline reference resonator is disposed in said cavity of said third crystalline body;

exposing said transducer package to said pressure and temperature so that said crystalline temperature resonator oscillates at a frequency responsive to said temperature and said crystalline reference resonator oscillates at a frequency essentially independent of said pressure; and generating temperature data signals and reference signals in response to said frequencies of said crystalline temperature resonator and said crystalline reference resonator.

* * * * *